United States Patent [19]

Anthony et al.

[11] 4,159,216

[45] Jun. 26, 1979

[54] ENHANCED LINE STABILITY BY ALLOYING OF DEPOSITION

[75] Inventors: Thomas R. Anthony; Harvey E. Cline, both of Schenectady, N.Y.

[73] Assignee: General Electric Company, Schenectady, N.Y.

[21] Appl. No.: 944,279

[22] Filed: Sep. 21, 1978

[51] Int. Cl.² .......................................... H01L 21/225
[52] U.S. Cl. ..................... 148/1.5; 148/178; 148/188
[58] Field of Search .................... 148/1.5, 178, 188

[56] References Cited

U.S. PATENT DOCUMENTS

| | | | |
|---|---|---|---|
| 2,813,048 | 11/1957 | Pfann | 148/1.5 X |
| 3,988,766 | 10/1976 | Anthony et al. | 148/188 X |
| 4,001,047 | 1/1977 | Boah | 148/1.5 |

*Primary Examiner*—G. Ozaki
*Attorney, Agent, or Firm*—Donald M. Winegar; Joseph T. Cohen; Charles T. Watts

[57] ABSTRACT

A saturated or a supersaturated solution of the material of a solid body of semiconductor material in a layer of metal to be migrated by thermal gradient zone melting processing is utilized to achieve uniform penetration of fine lines (1 mil in width and less) and small droplets (less than 6 mils in diameter) in order to produce reliable semiconductor devices.

9 Claims, No Drawings

ENHANCED LINE STABILITY BY ALLOYING OF DEPOSITION

BACKGROUND OF THE INVENTION

1. Field of the Invention

This invention relates to a method of migrating a melt of a metal through a solid body of semiconductor material by thermal gradient zone melting (TGZM) and, in particular, to the uniform initiation of migration by enhancing the penetration of melts into the material at the surface when fine liquid lines or small diameter liquid droplets are being migrated.

2. Description of the Prior Art

W. G. Pfann in U.S. Pat. Nos. 2,739,088 and 2,813,048 describes methods of migrating melts of metal through particular regions of a solid body of semiconductor material by thermal gradient zone melting. However, molten line and droplet stability resulted in the breakup of the migrating lines and droplets and consequently acceptable semiconductor devices were not always obtainable.

Recently, we discovered that preferred planar orientation of the surfaces of the body of semiconductor material, migration axis and line orientation axis relationship were also a necessity to migrate liquid metal wires and/or droplets through the solid body. (See U.S. Pat. Nos. 3,899,362 and 3,904,442) for example. These improvements in TGZM resulted in commercialization of the process. However, as the width of the lines being migrated became smaller, the penetration of fine liquid lines of less than 2 mil in width, and preferably 1 mil in width, and small liquid droplets, less than 6 mils in diameter, from the surface of a wafer or body of semiconductor material has been difficult to achieve repeatedly, on a commercial basis, by a thermal gradient zone. Although a thermal gradient is strong enough to cause migration of the small liquid zones once they are formed in the bulk of semiconductor material, the thermal gradient force is not powerful enough to overcome the surface tension forces holding fine liquid zones, or wires, on the surface of a body, or wafer. Further improvements to the TGZM processing techniques included alloying the deposited metal to the surface (U.S. Pat. No. 3,897,277) and sintering of the same (U.S. Pat. No. 4,006,040). The problem still persists as one attempts to migrate fine lines and droplets on a commercial basis. As a result, TGZM to date has been limited to line and droplet dimensions typical of solid-state power devices and has not had any commerical impact on integrated-circuit type devices which require a much finer size doped region.

Therefore, it is an object of this invention to provide a new and improved method to migrate fine molten lines and droplets of metal through a solid body of semiconductor material by thermal gradient zone melting (TGZM) processing which overcomes the deficiencies of the prior art.

Another object of this invention is to provide a new and improved method for initiating the penetration of fine molten metal wires and droplets into the surface region of a solid body for migration therethrough by TGZM by providing an overcoating of the semiconductor material on the metal to be migrated by TGZM.

A further object of this invention is to provide a new and improved method of initiating fine metal molten wires and droplets into the surface region of a solid body for migration therethrough by TGZM by providing a melt which is formed from a codeposited material consisting of at least one dopant material and material which is of the same material of the solid body.

Other objects of this invention will, in part, be obvious and will, in part, appear hereinafter.

BRIEF DESCRIPTION OF THE INVENTION

In accordance with the teachings of this invention there is provided an improvement in the method of moving a melt of a metal-rich semiconductor material through a solid body of semiconductor material. The improvement consists of producing either a saturated or a supersaturated solution of semiconductor material of the solid body in the metal layer deposited on the surface of preferred planar crystal orientation prior to establishing the temperature gradient in the body for practicing thermal gradient zone melting processing. The layer of saturated metal may be formed by depositing an overlayer of semiconductor material of the body on the layer of metal to be migrated. The semiconductor overlayer may be deposited on the metal layer by either epitaxial or heteroepitaxial growth techniques.

The layer of saturated metal may also be formed in a like manner as the supersaturated layer by codeposition techniques such as by preparing a master alloy of the desired composition. This master alloy is then utilized as a source in vapor depositing the metal layer on the surface of body where initiation of TGZM processing is desired. Alternatively, the material composition of the layer is achieved by employing a plurality of individual sources of metals comprising the material composition of the layer. When the semiconductor material is silicon and the metal to be migrated is aluminum, silicon comprises greater than 11 atomic percent of the layer of metal.

Employing this improved method the penetration of lines of less than 1 mil in width and droplets of less than 6 mils in diameter have been successfully achieved on a separation basis and migrated through a solid body.

The level of supersaturation is determined by the liquidus curve of the metal-semiconductor material system.

DESCRIPTION OF THE INVENTION

A body of semiconductor material is selected for a particular level of resistivity and a first type conductivity. The body has opposed major surfaces which are the top and bottom surfaces respectively thereof. The semiconductor material comprising the body may be silicon, germanium, silicon carbide, gallium arsenide, a compound of a Group II element and a Group VI element, and a compound of a Group III and a Group V element.

The thermal migration of metal wires is preferably practiced in accordance with the planar orientations, thermal migration directions, stable wire directions and stable wire sizes of the following table.

| Wafer Plane | Migration Direction | Stable Wire Directions | Stable Wire Sizes |
|---|---|---|---|
| (100) | <100> | <011>* | <100 microns |
|  |  | <011>* | <100 microns |
| (100) | <110> | <110>* | <150 microns |
| (111) | <111> | a)<011> | |
|  |  | <101> | <500 microns |
|  |  | <110> | |
|  |  | b)<112>* | |
|  |  | <211>* | <500 microns |
|  |  | <121>* | |
|  |  | c)Any other* | |

| Wafer Plane | Migration Direction | Stable Wire Directions | Stable Wire Sizes |
|---|---|---|---|
| | | direction in (111) plane. | <500 microns |

*The stability of migrating wire is sensitive to the alignment of the thermal gradient with the <100>, <110> and <111> axis, respectively
°Group a is more stable than group b which is more stable than group c.

Droplets are migrated in the Migration Direction. The shape of the droplet is determined by the wafer plane orientation and migration direction. In a crystal axis direction of <111> thermal migration, the droplet migrates as a triangular platelet laying in a (111) plane. A droplet migrates in the <100> crystal axis direction as a regular pyramid bounded by four forward (111) planes and a rear (100) plane. A droplet migrates in the <110> crystal axis direction as an irregular pyramid with a diamond base.

The temperature gradient zone melting process and apparatus is not of this invention. For a more thorough understanding of the temperature gradient zone melting process employed in this invention and for a more thorough description of the apparatus employed for this process, one is directed to the following U.S. Patents entitled Method of Making Deep Diodes, U.S. Pat. No. 3,901,736; Deep Diode Device and Method, U.S. Pat. No. 3,902,925; Deep Diode Devices and Method and Apparatus, U.S. Pat. No. 4,091,257; High Velocity Thermomigration Method of Making Deep Diodes, U.S. Pat. No. 3,898,106; Deep Diode Device and Method, U.S. Pat. No. 3,902,925; The Stabilized Droplet Method of Making Deep Diodes Having Uniform Electrical Properties, U.S. Pat. No. 3,899,361; Method of Making Isolation Grids in Bodies of Semiconductor Material, U.S. Pat. No. 3,979,230; and Thermomigration of Metal-Rich Liquid Wires Through Semiconductor Materials, U.S. Pat. No. 3,899,962.

The surface of the body of semiconductor material is prepared by usual semiconductor processing techniques for deposition of the metal to be migrated through the solid body of material. The metal may be deposited by any suitable means on the surface of initiation of melt migration. For example, when the body is of N-Type silicon semiconductor material and the melt to be migrated comprises, at least in part, aluminum, it has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum.

The melt of metal to be migrated, for example aluminum through silicon, is an alloy of the metal to be migrated containing a supersaturated solution of the material comprising the material of the semiconductor body. In this method the supersaturation is preferably based on the liquidus curve of the metal. This preferred processing technique may be achieved by either of two methods. In a first method the metal of the melt is deposited on the surface of the semiconductor body first and covered with a layer of the material comprising the solid body through which thermal gradient zone melting is to be practiced. In the second method, the metal alloy of the melt to be migrated is obtained, in part, by codepositing the dopant material and the semiconductor material to form the desired pattern of the lines and/or disc-like shapes.

For example, a layer of aluminum metal in the desired pattern of metal to be migrated is deposited on the surface of a silicon body N-type resistivity by suitable means as described heretofore. The thickness of the layer of metal is from 0.5 microns to 30 microns as required. A layer of silicon of at least from 0.05 microns to 3 microns in thickness is deposited on the layer of aluminum. When the layer of silicon is deposited by suitable means for growing epitaxial silicon it is epitaxially grown at sufficiently high rates at temperatures which are above 900° C., a temperature which is about 300° C. above the melting point of an aluminum-silicon metal deposit.

Alternatively, the silicon is grown heteroepitaxially on a thin metal alumina ($Al_2O_3$) film which naturally occurs on the aluminum metal deposit when exposed to air. Such heteroepitaxial growth of silicon occurs best at elevated temperatures between about 950° C. and about 1100° C. We have discovered that although both the aluminum-rich volume of material in the vicinity of metal deposit and the aluminum deposit would be liquid during the silicon deposition process, the thin skin of native $Al_2O_3$ remains solid and intact within this temperature range. Therefore, we are able to achieve effective silicon heteroepitaxy rates of deposition of the order of 1 micron per minute. Care is taken that little, if any, thermal gradient is established across the thickness of the wafer.

In the codeposition technique when a supersaturated metal deposit on the initiation surface is subjected to a thermal gradient, the semiconductor material immediately precipitates out a solid at the rear surface to seal the melt zone in the surface of the wafer. Melt migration thereto proceeds as described in the aforementioned issued patent. When the body is of P or N-Type silicon and the metal to be migrated is aluminum, and upon the silicon wafer with the supersaturated aluminum deposition in a thermal gradient, the silicon immediately precipitates out as a solid on the thermodynamically favorable cold rear interface of the deposited zone, thereby covering over and sealing the zone in the wafer. This silicon precipitation can occur in the solid state as solid state diffusion rates are rapid enough in an aluminum film near the eutectic temperature of 577° C. Solid state diffusion may be practiced in an aluminum film of $10\mu$ thickness at from 500°–570° C. when the wafer is heated at this temperature range for from 5 minutes to 15 minutes. Actually, if silicon is present in amounts greater than 1.6 atomic percent, solid state diffusion can be practiced successfully to achieve uniform penetration of the wire line. The resulting melt has a silicon saturated solution which is determined by the solidus curve of the metal-semiconductor system.

Alternatively, precipitation of silicon occurs directly from the liquid state on initial melting of the zone during the thermal migration process when the codeposited metal is heated directly to migration temperature. The percentage of silicon in the deposited alloy should be greater than 11 atomic percent, the liquid solubility of silicon in aluminum at the eutectic point. Increasing the amount of silicon in the deposition will increase the amount of silicon precipitated behind the droplet and will also insure that the precipitate cover will not be redissolved at a higher processing temperature. The preferred silicon content of the aluminum alloy deposition for various processing temperatures is shown in the following Table:

| Processing Temperature | Silicon Content of Deposition atomic % |
|---|---|
| All Temperatures | >11 atomic % |
| | Preferred Content |
| 600° | 11% |
| 700 | 20% |
| 800 | 28% |
| 900 | 35% |
| 1000 | 44% |
| 1100 | 53% |
| 1200 | 64% |
| 1300 | 78% |
| 1400 | 95% |

The codeposition of the materials may be practiced in several ways. For example, the desired composition of the layer of metal may be prepared as a separate master alloy and vapor deposited by such suitable means as by an electron beam deposition technique. Alternatively, the layer of metal may be deposited by employment of a plurality of metal sources, each source consisting of only the specific metal of the metal layer composition.

Regardless of the method employed to deposit the desired shape of the metal to be migrated, thermal gradient zone melting processing is practiced as before. The processed body or wafer is placed in a suitable thermal gradient zone melting apparatus and a thermal gradient of from 50°/cm up to 200°/cm or more is established substantially perpendicular to the two major surfaces of the body and substantially parallel to the major crystal axis of migration.

By employing of the improvements in TGZM processing, the penetration of fine lines of less than 1 mil in width and droplets of less than 6 mils in diameter has been successfully achieved on a repetitive basis. These geometric configurations have then been successfully migrated through the solid body by TGZM processing. Upon completing migration, the wafer or body is further processed by typical semiconductor processing techniques to complete the device fabrication.

We claim as our invention:

1. In the method of moving a melt of metal-rich semiconductor material through a solid body of semiconductor material by thermal gradient zone melting processing comprising the step of
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. the surface having the preferred planar crystal structure orientation to accommodate one or more physical configurations of a layer of metal thereon;
   c. depositing a layer of metal on the selected surface of the body of semiconductor material;
   d. heating the body and the metal deposited to a temperature sufficient to form a melt of metal-rich material on the surface of the body;
   e. establishing a temperature gradient along substantially the vertical axis of the body and the first axis of the crystal structure;
   f. migrating the metal-rich melt through the body along the first axis of the crystal structure to divide the body into a plurality of regions of first type conductivity and to form at least one array of regions of recrystallized material of the body having solid solubility of the vapor deposited metal therein, the metal including at least one dopant impurity material therein to impart a second and opposite type conductivity and a selected level of resistivity thereto;

the improvement in the method of processing which includes
   producing at least a saturated solution of semiconductor material of the body in the metal layer deposited on the surface of preferred planar crystal orientation prior to establishing the temperature gradient in the body to achieve substantially uniform penetration of the surface by the melt when the thermal gradient is established, the level of saturation being determined by the liquidus curve of the metal-semiconductor material system.

2. The method of claim 1 wherein the improvement in the method of processing comprises:
   depositing an overlayer of the material of the body on the layer of metal prior to heating the body and the layer of metal to form the metal-rich melt of material to migrated, the resulting melt being a saturated solution.

3. The improved method of claim 2 wherein
   the semiconductor material is silicon, the layer of metal is aluminum, and the material comprising the overlayer is silicon.

4. The improved method of claim 2 wherein
   the silicon overlayer material is deposited by epitaxial growth.

5. The improved method of claim 2 wherein
   the silicon overlayer material is deposited by heteroepitaxial growth.

6. The improved method of claim 1 wherein
   the layer of metal comprises at least one material to be migrated through the body to produce a recrystallized region of semiconductor material having a predetermined second type conductivity and a second level of resistivity and a predetermined amount of material of the body.

7. The improved method of claim 6 wherein
   the layer of metal is produced by codeposition of the materials, and
   the melt is one selected from the group consisting of a saturated solution and a supersaturated solution.

8. The improved method of claim 7 wherein
   the semiconductor material is silicon,
   the at least one material to be migrated is aluminum, silicon comprises greater than 11 atomic percent of the layer of metal, and
the resulting melt is a supersaturated solution.

9. The improved method of claim 7 wherein
the semiconductor material is silicon,
the at least one material to be migrated is aluminum,
silicon comprises greater than 1.6 atomic percent of the layer of metal, and including the additional step prior to initiating migration of heating the matrix body and layer of metal to a temperature of from 500° C. to 570° C. to cause silicon to diffuse by solid state diffusion to migrate to the top of the layer and seal the layer of metal therein.

* * * * *